(12) United States Patent
Nishimoto et al.

(10) Patent No.: US 11,939,270 B2
(45) Date of Patent: Mar. 26, 2024

(54) PRODUCTION METHOD FOR COPPER/CERAMIC JOINED BODY, PRODUCTION METHOD FOR INSULATED CIRCUIT BOARD, COPPER/CERAMIC JOINED BODY, AND INSULATED CIRCUIT BOARD

(71) Applicant: MITSUBISHI MATERIALS CORPORATION, Tokyo (JP)

(72) Inventors: Shuji Nishimoto, Saitama (JP); Satoshi Takakuwa, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 420 days.

(21) Appl. No.: 17/418,384

(22) PCT Filed: Feb. 4, 2020

(86) PCT No.: PCT/JP2020/004089
§ 371 (c)(1),
(2) Date: Jun. 25, 2021

(87) PCT Pub. No.: WO2020/162445
PCT Pub. Date: Aug. 13, 2020

(65) Prior Publication Data
US 2022/0064074 A1    Mar. 3, 2022

(30) Foreign Application Priority Data
Feb. 4, 2019    (JP) .................... 2019-017893

(51) Int. Cl.
*C04B 37/02* (2006.01)
*B23K 1/19* (2006.01)
(Continued)

(52) U.S. Cl.
CPC .............. *C04B 37/021* (2013.01); *B23K 1/19* (2013.01); *B32B 15/04* (2013.01); *B32B 15/20* (2013.01);
(Continued)

(58) Field of Classification Search
CPC ........... C04B 37/021; C22C 9/00; B23K 1/19; B32B 15/04; B32B 15/20; H05K 1/0306
See application file for complete search history.

(56) References Cited

U.S. PATENT DOCUMENTS

| 2014/0192486 A1 | 7/2014 | Kuromitsu et al. |
| 2016/0221305 A1 | 8/2016 | Terasaki et al. |
| 2022/0225498 A1* | 7/2022 | Yuasa .................. H05K 1/09 |

FOREIGN PATENT DOCUMENTS

| DE | 202016008371 U1 | 9/2017 |
| JP | S46-32333 B | 9/1971 |

(Continued)

OTHER PUBLICATIONS

Notice of Reasons for Rejecting a Request for Correction dated Feb. 24, 2022, issued for Japanese Patent Application No. 2021-700773 (2020-543647) and English translation thereof.
(Continued)

*Primary Examiner* — Zachary M Davis
(74) *Attorney, Agent, or Firm* — Locke Lord LLP

(57) ABSTRACT

A method of producing a copper/ceramic bonded body, the copper member having a composition having a Cu purity of 99.96 mass % or more, a balance of inevitable impurities, a P content of 2 mass ppm or less, and a total content of Pb, Se and Te of 10 mass ppm or less, the method includes bonding the laminated copper member and the ceramic member by pressing and heating, wherein an average crystal grain size of the copper member before bonding is 10 μm or more, an aspect ratio is 2 or less, and a pressing load is 0.05
(Continued)

MPa or more and 1.5 MPa or less, a heating temperature is 800° C. or higher and 850° C. or lower, and a holding time at the heating temperature is 10 minutes or longer and 90 minutes or shorter.

11 Claims, 6 Drawing Sheets

(51) Int. Cl.
*B32B 15/04* (2006.01)
*B32B 15/20* (2006.01)
*C22C 9/00* (2006.01)
*C22F 1/08* (2006.01)
*H05K 1/03* (2006.01)
*B23K 101/42* (2006.01)
*B23K 103/00* (2006.01)
*B23K 103/12* (2006.01)

(52) U.S. Cl.
CPC .................. *C22C 9/00* (2013.01); *C22F 1/08* (2013.01); *H05K 1/0306* (2013.01); *B23K 2101/42* (2018.08); *B23K 2103/12* (2018.08); *B23K 2103/52* (2018.08); *B32B 2457/08* (2013.01); *C04B 2237/407* (2013.01); *H05K 2201/0338* (2013.01)

(56) References Cited

FOREIGN PATENT DOCUMENTS

| | | |
|---|---|---|
| JP | H04-162756 A | 6/1992 |
| JP | H04-187577 A | 7/1992 |
| JP | H06-002058 A | 1/1994 |
| JP | H08-139420 A | 5/1996 |
| JP | 3211856 B2 | 9/2001 |
| JP | 2004-152904 A | 5/2004 |
| JP | 2013-041913 A | 2/2013 |
| JP | 2015-092552 A | 5/2015 |
| JP | 2016-115821 A | 6/2016 |
| JP | 2017-075382 A | 4/2017 |
| JP | 2018-204108 A | 12/2018 |
| WO | 2016/111207 A1 | 7/2016 |

OTHER PUBLICATIONS

Office Action dated Apr. 6, 2022, issued for Chinese Patent Application No. 202080009874.7 and English translation of the Search Report.
International Search Report dated Apr. 21, 2020, issued for PCT/JP2020/004089 and English translation thereof.
Seigi Aoyama et al., "Effects of Hot-Working Processes and Impurities on the Properties of Cold-Drawn Cu Wires", J. Japan Institute Metals, vol. 51, No. 9, 1987, 858-863 and English abstract thereof. (cited in the Nov. 21, 2022 Decision on Opposition issued for JP2021-700773).
Shin-ichi Nishiyama, "Dilute alloy which made latest oxygen free copper *-* ", Proceedings of Workshop of the Japan Institute of Metals, Japan Institute of Metals, 1989, vol. 28, No. 2, 1989, pp. 137-145. (cited in the Nov. 21, 2022 Decision on Opposition issued for JP2021-700773).
E-Metals "High-purity-copper-Cu>=99.9999% plate material", A metallic material mail order [E-Metals.net], [online], [date of search Jul. 6, 2022], The Internet <URL:https://www.e-metals.net/product/201347>. (cited in the Nov. 21, 2022 Decision on Opposition issued for JP2021-700773).
Hajime Koto, "Studies on OFHC Copper (3rd Report). On Recrystallization Diagram and Grain Growth", Japan Institute of Metals, vol. 22, No. 10, 1958, pp. 493-497 and English abstract thereof. (cited in the Nov. 21, 2022 Decision on Opposition issued for JP2021-700773).
Decision on Opposition mailed Nov. 21, 2022, issued for Japanese Patent Application No. 2021-700773 (2020-543647) and Machine English translation obtained by Global Dossier on Dec. 21, 2022.
Supplementary European Search Report dated Oct. 5, 2022, issued for European Patent Application No. 20752718.5.
Notice of Allowance dated May 3, 2023, issud for European Patent Application No. 20752718.5.

* cited by examiner

PRODUCTION METHOD FOR COPPER/CERAMIC JOINED BODY, PRODUCTION METHOD FOR INSULATED CIRCUIT BOARD, COPPER/CERAMIC JOINED BODY, AND INSULATED CIRCUIT BOARD

TECHNICAL FIELD

This invention relates to A method of producing a copper/ceramic bonded body in which a copper member and a ceramic member are bonded to each other, A method of producing an insulating circuit board, a copper/ceramic bonded body, and an insulating circuit board.

Priority is claimed on Japanese Patent Application No. 2019-017893, filed Feb. 4, 2019, the content of which is incorporated herein by reference.

BACKGROUND ART

In the related art, copper or a copper alloy having high conductivity has been used for electric and electronic components such as heat sinks and thick copper circuits.

Recently, with the increase in the current of electronic devices, electric devices, and the like, the size and thickness of electric and electronic components used in such electronic devices, electric devices, and the like have increased in order to reduce the current density and diffuse heat due to Joule heating.

In addition, a power module, an LED module, and a thermoelectric module have a structure in which a power semiconductor element, an LED element, and a thermoelectric element are bonded to an insulating circuit board in which a circuit layer made of a conductive material is formed on one surface of an insulating layer.

As such an insulating circuit board, one provided with a ceramic substrate and a circuit layer formed by bonding a metal plate having excellent conductivity to one surface of the ceramic substrate has been widely used in the related art. As an insulating circuit board, one having a metal layer formed by bonding a metal plate to the other surface of the ceramic substrate is also provided.

For example, Patent Document 1 proposes an insulating circuit board in which a first metal plate and a second metal plate respectively constituting a circuit layer and a metal layer are formed of a copper plate, and the copper plates are directly bonded to a ceramic substrate by a DBC method. In the DBC method, the copper plates and the ceramic substrate are bonded by generating a liquid phase at the interfaces between the copper plates and the ceramic substrate using a eutectic reaction of copper and copper oxides.

In addition, Patent Document 2 proposes an insulating circuit board in which a circuit layer and a metal layer are formed by bonding copper plates to one surface and the other surface of a ceramic substrate. In the insulating circuit board, the copper plates are disposed on one surface and the other surface of the ceramic substrate with a Ag—Cu—Ti-based brazing material interposed therebetween, and the copper plates are bonded thereto by performing a heating treatment (so-called active metal brazing method). In the active metal brazing method, since the brazing material containing Ti as an active metal is used, the wettability between the molten brazing material and the ceramic substrate is improved, and the ceramic substrate and the copper plates are reliably bonded to each other.

Here, when the ceramic substrate and the copper plates are bonded to each other as described in Patent Document 1 or Patent Document 2, the bonding temperature is often set to 800° C. or higher, and there is concern that a part of crystal grains of the copper plates may become coarse during bonding. In particular, in the case of a copper plate made of pure copper having particularly excellent conductivity and heat radiation, crystal grains are more likely to become coarse. When the crystal grains become coarse in the copper plates (circuit layer and metal layer) after the bonding, there is concern of causing a problem in external appearance.

Therefore, for example, Patent Document 3 proposes a pure copper material with which the growth of crystal grains is suppressed.

In Patent Document 3, it is described that by including 0.0006 to 0.0015 wt % of S, it is possible to adjust the crystal grains to a certain size even if a heat treatment is performed at a recrystallization temperature or higher.

CITATION LIST

Patent Documents

[Patent Document 1]
Japanese Unexamined Patent Application, First Publication No. H4-162756
[Patent Document 2]
Japanese Patent No. 3211856
[Patent Document 3]
Japanese Unexamined Patent Application, First Publication No. H6-002058

SUMMARY OF INVENTION

Technical Problem

However, in Patent Document 3, although the coarsening of crystal grains is suppressed by specifying the S content, even if the S content is simply specified, an effect of suppressing the coarsening of crystal grains cannot be sufficiently obtained.

Furthermore, in a case where the S content is increased in order to suppress the coarsening of crystal grains, the crystal grains are locally coarsened after bonding, and the crystal structure becomes non-uniform, which may lead to variation in grain size. In this case, when the bonded state between the copper plates and the ceramic substrate is ultrasonically inspected, there is a problem that noise is increased and the ultrasonic inspection cannot be performed accurately.

In addition, when a temperature cycle at a high temperature is applied, undulations are formed on the surface of the circuit layer, and there is concern that an element mounting portion may be destroyed, the thermal resistance may be increased, or the element bonded to the circuit layer may be peeled off.

This invention has been made in view of the above-described circumstances, and an objective thereof is to provide A method of producing a copper/ceramic bonded body in which the coarsening and non-uniformity of crystal grains of a copper member can be suppressed even after bonding and undulations on the surface of the copper member can be suppressed even in a case where a temperature cycle is applied, A method of producing an insulating circuit board, a copper/ceramic bonded body, and an insulating circuit board.

Solution to Problem

In order to solve these problems and achieve the above-mentioned object, the present inventors conducted intensive examinations. As a result, it was found that impurity elements that are contained in a pure copper material in a small amount and are present at crystal grain boundaries have a crystal grain growth suppressing effect of suppressing the coarsening of crystal grains. Accordingly, it was found that by utilizing such elements having a crystal grain growth suppressing effect (hereinafter, referred to as crystal grain growth suppressing elements), it is possible to suppress the coarsening and non-uniformity of crystal grains even after heating. In addition, it was found that it is effective to regulate the content of specific elements in order for the crystal grain growth suppressing elements to act sufficiently.

Furthermore, it was found that when a copper member and a ceramic member are bonded to each other, the crystal grains of the copper member tend to be coarsened by a pressing load during the bonding.

The present invention has been made based on the above findings, and a method of producing a copper/ceramic bonded body with a copper member and a ceramic member bonded each other, the copper member having a composition having a Cu purity of 99.96 mass % or more, a balance of inevitable impurities, a P content of 2 mass ppm or less, and a total content of Pb, Se and Te of 10 mass ppm or less, the method includes: a bonding step of bonding the copper member and the ceramic member laminated to each other by pressing the laminated copper member and ceramic member in a laminating direction and heating, wherein an average crystal grain size of the copper member before bonding is set to 10 μm or more, an aspect ratio, which means a ratio of a major axis to a minor axis of a crystal grain on a rolled surface, is set to 2 or less, and in the bonding step, a pressing load in the laminating direction is set to be in a range of 0.05 MPa or more and 1.5 MPa or less, a heating temperature is set to be in a range of 800° C. or higher and 850° C. or lower, and a holding time at the heating temperature is set to be in a range of 10 minutes or longer and 90 minutes or shorter.

In The method of producing a copper/ceramic bonded body having this configuration, since the amount of P is set to 2 mass ppm or less, the inhibition of the effect of crystal grain growth suppressing elements, which are present at the grain boundaries in a trace amount, by P can be suppressed, and it is possible to suppress the coarsening and non-uniformity of the crystal grains even after bonding. In addition, since elements such as Pb, Se, and Te have a low solid solubility limit in Cu and correspond to the crystal grain growth suppressing elements that suppress the coarsening of the crystal grains by segregation at the grain boundaries, the elements may be contained in a trace amount. However, when these elements are bonded to ceramic, these elements promote local grain growth. Therefore, by limiting the total content of Pb, Se, and Te to 10 mass ppm or less, grain growth can be suppressed.

Furthermore, since the average crystal grain size of the copper member before bonding is set to 10 m or more and the aspect ratio (major axis/minor axis) of the crystal grains on the rolled surface is set to 2 or less, a large strain is not accumulated in the copper member before bonding, the driving force for recrystallization becomes smaller, and in the subsequent bonding step, the local coarsening of the crystal grains can be suppressed even if the bonding is performed under the conditions that the pressing load in the laminating direction is in a range of 0.05 MPa or more and 1.5 MPa or less, the heating temperature is in a range of 800° C. or higher and 850° C. or lower, and the holding time at the heating temperature is in a range of 10 minutes or longer and 90 minutes or shorter.

Therefore, even after bonding, it is possible to suppress the coarsening and non-uniformity of the crystal grains of the copper member.

Here, in the method of producing a copper/ceramic bonded body of the present invention, it is preferable that an aspect ratio R0 of the crystal grain on the rolled surface of the copper member before the bonding, an aspect ratio R1 of the crystal grain on the rolled surface of the copper member after the bonding, and an average crystal grain size D1 on the rolled surface of the copper member after the bonding satisfy the following relational expression RD, Relational expression RD=$D_1 \times (R_1/R_0) \leq 500$.

In this case, since the above relational expression RD is satisfied, the local coarsening of the crystal grains of the copper member can be reliably suppressed even after bonding.

In addition, in the method of producing a copper/ceramic bonded body of the present invention, it is preferable that a S content in the copper member is set to be in a range of 2 mass ppm or more and 20 mass ppm or less.

In this case, since the copper member contains 2 mass ppm or more of S, which corresponds to the crystal grain growth suppressing element, it is possible to reliably suppress the coarsening and non-uniformity of the crystal grains even after bonding.

Furthermore, in the method of producing a copper/ceramic bonded body of the present invention, it is preferable that a total content of Mg, Sr, Ba, Ti, Zr, Hf, and Y in the copper member is 10 mass ppm or less.

Since elements such as Mg, Sr, Ba, Ti, Zr, Hf, and Y, which may be contained as inevitable impurities, generate compounds with S, Se, Te, and the like, which are crystal grain growth suppressing elements, there is concern that the action of these crystal grain growth suppressing elements may be inhibited. Therefore, by limiting the total content of Mg, Sr, Ba, Ti, Zr, Hf, and Y to 10 mass ppm or less, a crystal grain growth suppressing effect by the crystal grain growth suppressing elements can be sufficiently exhibited. Therefore, even after the bonding, it is possible to reliably suppress the coarsening and non-uniformity of the crystal grains of the copper member.

In addition, a method of producing an insulating circuit board of the present invention is a method of producing an insulating circuit board with a ceramic substrate and a copper plate bonded to a surface of the ceramics substrate, the method including the step of: bonding the ceramic substrate as the ceramic member and the copper plate as the copper member to each other by the method of producing a copper/ceramic bonded body described above.

According to the production method of an insulating circuit board having this configuration, since the ceramic substrate and the copper plate are bonded to each other by the production method of copper/ceramic bonded body described above, it is possible to suppress the coarsening and non-uniformity of the crystal grains of the copper plate even after bonding.

Therefore, it is possible to accurately evaluate the bonding state between the ceramic substrate and the copper plate by ultrasonic inspection.

A copper/ceramic bonded body of the present invention is a copper/ceramic bonded body including a copper member and a ceramic member bonded to each other, wherein the copper member has a composition having a Cu purity of 99.96 mass % or more, a balance of inevitable impurities, a P content of 2 mass ppm or less, and a total content of Pb, Se and Te of 10 mass ppm or less, in a cross section of the copper member, a maximum area ratio is set to 45% or less when a crystal orientation map of copper obtained by EBSD is trisected into (001) planes, (111) planes, and (101) planes, and a grain boundary length in a field of view of 1 mm² in the cross section of the copper member is set to 10 mm or more and less than 30 mm.

In the copper/ceramic bonded body having this configuration, since the amount of P is set to 2 mass ppm or less, the inhibition of the effect of crystal grain growth suppressing elements, which are present at the grain boundaries in a trace amount, by P can be suppressed, and it is possible to suppress the coarsening and non-uniformity of the crystal grains even after bonding. In addition, by limiting the total content of Pb, Se, and Te to 10 mass ppm or less, grain growth can be suppressed.

In addition, in the cross section of the copper member, since the maximum area ratio when the crystal orientation map of copper obtained by EBSD is trisected into (001) planes, (111) planes, and (101) planes is set to 45% or less and the grain boundary length in a field of view of 1 mm² in the cross section of the copper member is set to 10 mm or more and less than 30 mm, even in a case where a temperature cycle is applied, the accumulation of strain in the copper member and the occurrence of undulations on the surface of the copper member can be suppressed.

Here, in the copper/ceramic bonded body of the present invention, it is preferable that as a result of observing the cross section of the copper member by an electron backscatter diffraction method, a proportion of twin boundaries represented by Σ3 grain boundaries to total grain boundaries is 50% or less.

In this case, in the copper member, the proportion of normal grain boundaries is secured, strain can be accumulated in the normal grain boundaries when a temperature cycle is applied, and the occurrence of undulations on the surface of the copper member can be more accurately suppressed.

In addition, in the copper/ceramic bonded body of the present invention, it is preferable that when an arithmetic average roughness of a surface of the copper member after conducting a temperature cycle test of holding at −45° C. for 30 minutes and holding at 250° C. for 30 minutes is defined as Rat, and an arithmetic average roughness of the surface of the copper member before conducting the temperature cycle test is defined as $Ra_0$, $Ra_1/Ra_0$ is in a range of 1.0 or more and 1.8 or less.

In this case, the surface roughness of the copper member is not significantly increased even after conducting the temperature cycle test, and it is possible to reliably suppress the occurrence of undulations.

An insulating circuit board of the present invention is an insulating circuit board including: a ceramic substrate and a copper plate bonded to a surface of the ceramic substrate, wherein the copper plate has a composition having a Cu purity of 99.96 mass % or more, a balance of inevitable impurities, a P content of 2 mass ppm or less, and a total content of Pb, Se and Te of 10 mass ppm or less, in a cross section of the copper plate, a maximum area ratio is set to 45% or less when a crystal orientation map of copper obtained by EBSD is trisected into (001) planes, (111) planes, and (101) planes, and a grain boundary length in a field of view of 1 mm² in the cross section of the copper plate is set to 10 mm or more and less than 30 mm.

In the insulating circuit board having this configuration, since the amount of P is set to 2 mass ppm or less, the inhibition of the effect of crystal grain growth suppressing elements, which are present at the grain boundaries in a trace amount, by P can be suppressed, and it is possible to suppress the coarsening and non-uniformity of the crystal grains even after bonding. In addition, by limiting the total content of Pb, Se, and Te to 10 mass ppm or less, grain growth can be suppressed.

In addition, in the cross section of the copper plate, since the maximum area ratio when the crystal orientation map of copper obtained by EBSD is trisected into (001) planes, (111) planes, and (101) planes is set to 45% or less and the grain boundary length in a field of view of 1 mm² in the cross section of the copper plate is set to 10 mm or more and less than 30 mm, even in a case where a temperature cycle is applied, the accumulation of strain in the copper plate and the occurrence of undulations on the surface of the copper plate can be suppressed.

Here, in the insulating circuit board of the present invention, it is preferable that as a result of observing the cross section of the copper plate by an electron backscatter diffraction method, a proportion of twin boundaries represented by Σ3 grain boundaries to total grain boundaries is 50% or less.

In this case, in the copper plate, the proportion of normal grain boundaries is secured, strain can be accumulated in the normal grain boundaries when a temperature cycle is applied, and the occurrence of undulations on the surface of the copper plate can be more accurately suppressed.

In addition, in the insulating circuit board of the present invention, it is preferable that when an arithmetic average roughness of a surface of the copper plate after conducting a temperature cycle test of holding at −45° C. for 30 minutes and holding at 250° C. for 30 minutes is defined as Rat, and an arithmetic average roughness of the surface of the copper plate before conducting the temperature cycle test is defined as $Ra_0$, $Ra_1/Ra_0$ is in a range of 1.0 or more and 1.8 or less.

In this case, the surface roughness of the copper plate is not significantly increased even after conducting the temperature cycle test, and it is possible to reliably suppress the occurrence of undulations.

Advantageous Effects of Invention

According to the present invention, it is possible to provide A method of producing a copper/ceramic bonded body in which the coarsening and non-uniformity of crystal grains of a copper member can be suppressed even after bonding and undulations on the surface of the copper member can be suppressed even in a case where a temperature cycle is applied, A method of producing an insulating circuit board, a copper/ceramic bonded body, and an insulating circuit board.

DESCRIPTION OF EMBODIMENTS

Hereinafter, embodiments of the present invention will be described with reference to the accompanying drawings.

A copper/ceramic bonded body according to the present embodiment is an insulating circuit board 10 configured by bonding a ceramic substrate 11 which is a ceramic member to a copper plate (circuit layer 12) and a copper plate (metal layer 13), which are copper members.

Figure 1:
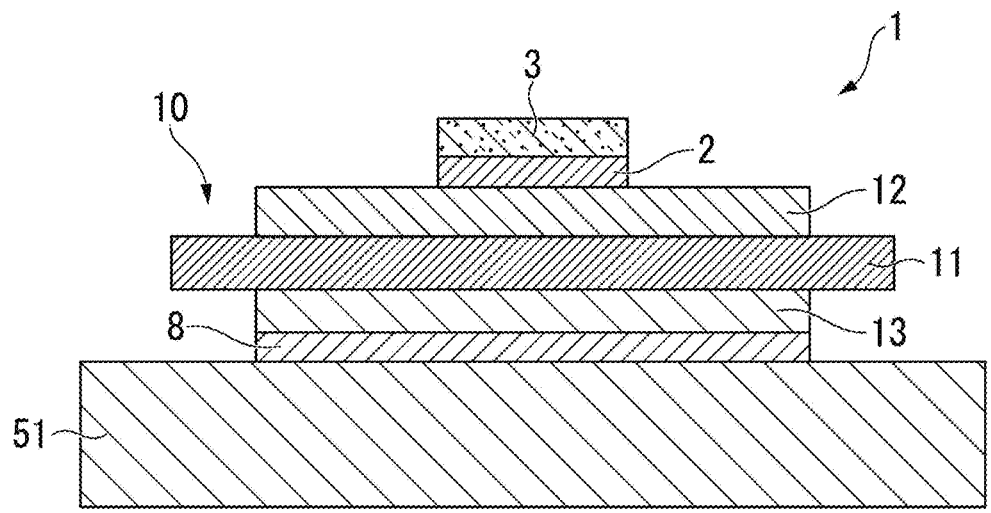
FIG. 1 is a schematic explanatory view of a power module using an insulating circuit board produced by A method of producing an insulating circuit board, which is an embodiment of the present invention.

FIG. 1 shows the insulating circuit board 10 which is the embodiment of the present invention and a power module 1 using the insulating circuit board 10.

The power module 1 includes the insulating circuit board 10, a semiconductor element 3 bonded to one side (upper side in FIG. 1) of the insulating circuit board 10 with a first solder layer 2 interposed therebetween, and a heat sink 51 bonded to the other side (lower side in FIG. 1) of the insulating circuit board 10 with a second solder layer 8 interposed therebetween.

The insulating circuit board 10 includes the ceramic substrate 11, the circuit layer 12 disposed on one surface (upper surface in FIG. 1) of the ceramic substrate 11, and the metal layer 13 disposed on the other surface (lower surface in FIG. 1) of the ceramic substrate 11.

The ceramic substrate 11 prevents the electrical connection between the circuit layer 12 and the metal layer 13, and is made of silicon nitride in the present embodiment. Here, the thickness of the ceramic substrate 11 is set to be in a range of 0.2 to 1.5 mm, and is set to 0.32 mm in the present embodiment.

The circuit layer 12 is formed by bonding the copper plate made of a pure copper material to one surface of the ceramic substrate 11.

A circuit pattern is formed on the circuit layer 12, and one surface thereof (upper surface in FIG. 1) becomes a mounting surface on which the semiconductor element 3 is mounted. Here, the thickness of the circuit layer 12 is set to be in a range of 0.1 mm or more and 2.0 mm or less, and is set to 0.6 mm in the present embodiment.

The metal layer 13 is formed by bonding the copper plate made of a pure copper material to the other surface of the ceramic substrate 11.

Here, the thickness of the metal layer 13 is set to be in a range of 0.1 mm or more and 2.0 mm or less, and is set to 0.6 mm in the present embodiment.

The heat sink 51 is for cooling the above-mentioned insulating circuit board 10, and in the present embodiment, is formed of a radiating plate made of a material having good thermal conductivity. In the present embodiment, the heat sink 51 is made of copper or a copper alloy excellent in thermal conductivity. The heat sink 51 and the metal layer 13 of the insulating circuit board 10 are bonded to each other with the second solder layer 8 interposed therebetween.

Here, the pure copper material forming the circuit layer 12 and the metal layer 13 has a composition in which the purity of Cu is 99.96 mass % or more, the balance contains inevitable impurities, the amount of P is set to 2 mass ppm or less, and the total content of Pb, Se, and Te is set to 10 mass ppm or less.

In addition, in the pure copper material forming the circuit layer 12 and the metal layer 13, the S content is preferably set to be in a range of 2 mass ppm or more and 20 mass ppm or less.

Furthermore, in the pure copper material forming the circuit layer 12 and the metal layer 13, the total content of Mg, Sr, Ba, Ti, Zr, Hf, and Y, which are the inevitable impurities, is preferably 10 mass ppm or less.

In cross sections of the circuit layer 12 and the metal layer 13, the maximum area ratio when a crystal orientation map of copper obtained by EBSD is trisected into (001) planes, (111) planes, and (101) planes is set to 45% or less.

In addition, in the cross sections of the circuit layer 12 and the metal layer 13, the grain boundary length in a field of view of 1 mm$^2$ is set to 10 mm or more and less than 30 mm.

In the present embodiment, as a result of observing the cross sections of the circuit layer 12 and the metal layer 13 by an electron backscatter diffraction method, it is preferable that the proportion of twin boundaries represented by Σ3 grain boundaries is 50% or less.

Furthermore, in the present embodiment, when the arithmetic average roughness of the surfaces of the circuit layer 12 and the metal layer 13 after conducting a temperature cycle test of holding at −45° C. for 30 minutes and holding at 250° C. for 30 minutes is defined as $Ra_1$, and the arithmetic average roughness of the surfaces of the circuit layer 12 and the metal layer 13 before conducting the temperature cycle test is defined as $Ra_0$, $Ra_1/Ra_0$ is preferably in a range of 1.0 or more and 1.8 or less.

Here, the reasons for defining the component composition, texture, and characteristics of the pure copper material forming the circuit layer 12 and the metal layer 13 as described above will be described below.

(Purity of Cu: 99.96 mass % or More)

Electric and electronic components for large current applications are required to have excellent conductivity and heat radiation in order to suppress heat generation during energization, and preferably use pure copper having particularly excellent conductivity and heat radiation.

Therefore, in the pure copper material forming the circuit layer 12 and the metal layer 13, the purity of Cu is defined as 99.96 mass % or more.

The purity of Cu is preferably 99.965 mass % or more, and more preferably 99.97 mass % or more. The upper limit of the purity of Cu is not particularly limited. However, in a case where the purity of Cu exceeds 99.999 mass %, a special refining step is required and the manufacturing cost increases significantly. Therefore, the purity of Cu is preferably set to 99.999 mass % or less.

(Amount of P: 2 Mass Ppm or Less)

P contained as an inevitable impurity is widely used as an element for detoxifying oxygen in copper. However, in a case where P is contained in a certain amount or more, the action of not only oxygen but also crystal grain growth suppressing elements present at the crystal grain boundaries is inhibited. Therefore, during heating to a high temperature, there is concern that the crystal grain growth suppressing elements may not sufficiently act, and there the coarsening and non-uniformity of crystal grains may occur.

Therefore, in the present embodiment, the amount of P in the pure copper material forming the circuit layer 12 and the metal layer 13 is limited to 2 mass ppm or less.

The amount of P is set to preferably 1.5 mass ppm or less, and more preferably 1 mass ppm or less.

(Total Content of Pb, Se, and Te: 10 Mass Ppm or Less)

Pb, Se, and Te are elements that have a low solid solubility limit in Cu and have an action of suppressing the coarsening of crystal grains by segregating to grain boundaries, but promote local grain growth.

Therefore, in the present embodiment, in order to secure hot workability, the total content of Pb, Se, and Te in the pure copper material forming the circuit layer 12 and the metal layer 13 is limited to 10 mass ppm or less.

In order to control the crystal grains favorably, the total content of Pb, Se, and Te is set to preferably 9 mass ppm or less, and more preferably 8 mass ppm or less.

(S Content: 2 Mass Ppm or More and 20 Mass Ppm or Less)

S is an element that has an action of suppressing the coarsening of crystal grains by suppressing crystal grain boundary movement and lowers hot workability.

Therefore, in the present embodiment, in a case where the S content in the pure copper material forming the circuit layer 12 and the metal layer 13 is set to 2 mass ppm or more, the effect of suppressing the coarsening of crystal grains by S can be sufficiently exerted, and it is possible to reliably suppress the coarsening of crystal grains even after heating. On the other hand, by limiting the S content to 20 mass ppm or less, local crystal grain growth can be controlled.

The lower limit of the S content is preferably 2.5 mass ppm or more, and more preferably 3 mass ppm or more. The upper limit of the S content is preferably 17.5 mass ppm or less, and more preferably 15 mass ppm or less.

(Total content of Mg, Sr, Ba, Ti, Zr, Hf, Y: 10 mass ppm or Less) Mg, Sr, Ba, Ti, Zr, Hf, and Y contained as inevitable impurities may form compounds with the crystal grain coarsening suppressing elements (S, Se, Te, and the like) that suppress the coarsening of crystal grains by segregating to the crystal grain boundaries, and there is concern that the action of the crystal grain coarsening suppressing elements may be inhibited.

Therefore, in the present embodiment, in order to reliably suppress the coarsening of crystal grains after heating, the total content of Mg, Sr, Ba, Ti, Zr, Hf, and Y in the pure copper material forming the circuit layer 12 and the metal layer 13 is preferably set to 10 mass ppm or less.

The total content of Mg, Sr, Ba, Ti, Zr, Hf, and Y is preferably 7.5 mass ppm or less, and more preferably 5 mass ppm or less.

(Other Inevitable Impurities)

As inevitable impurities other than the above-mentioned elements, there are Ag, B, Bi, Ca, Sc, rare earth elements, V, Nb, Ta, Cr, Mo, W, Mn, Re, Fe, Ru, Os, Co, Rh, Ir, Ni, Pd, Pt, Au, Zn, Cd, Hg, Al, Ga, In, Ge, Sn, As, Sb, Tl, Be, N, C, Si, Li, H, and O. Since there is concern that these inevitable impurities may reduce the conductivity the total content thereof is preferably set to 0.1 mass % or less.

The circuit layer 12 and the metal layer 13 made of the pure copper material having the above composition have an average crystal grain size in a range of 70 μm or more and 400 μm or less.

The lower limit of the average crystal grain size is preferably 90 μm or more, and more preferably 100 μm or more. The upper limit of the average crystal grain size is preferably 350 μm or less, and more preferably 300 μm or less.

Furthermore, in the circuit layer 12 and the metal layer 13, the ratio $d_{max}/d_{ave}$ of the maximum crystal grain size $d_{max}$ to the average crystal grain size $d_{ave}$ in a range of 35 mm×35 mm is set to 7.5 or less.

The above-mentioned $d_{max}/d_{ave}$ is preferably 6.0 or less, and more preferably 5.0 or less.

(Crystal Orientation of Copper by EBSD)

In the present embodiment, in a case where the crystal orientation is aligned in one direction, when a temperature cycle is applied, undulations tend to occur on the surfaces of the circuit layer 12 and the metal layer 13. Accordingly, there is concern that fracture and peeling may occur at the first solder layer 2 between the semiconductor element 3 and the circuit layer 12 and at the second solder layer 8 between the metal layer 13 and the heat sink.

Therefore, in the present embodiment, in the cross sections of the circuit layer 12 and the metal layer 13, the maximum area ratio when a crystal orientation map of copper obtained by EBSD is trisected into (001) planes, (111) planes, and (101) planes is set to 45% or less, and a crystal orientation that is not aligned in any of the (001) planes, (111) planes, and (101) planes but is random is achieved.

(Grain Boundary Length in Field of View of 1 mm$^2$)

In the present embodiment, in the cross sections of the circuit layer 12 and the metal layer 13, when the grain boundary length in a field of view of 1 mm$^2$ is 10 mm or more and less than 30 mm, a sufficient grain boundary length is secured, and strain can be accumulated at the grain boundaries when a temperature cycle is applied, so that it is possible to suppress the occurrence of undulations on the surfaces of the circuit layer 12 and the metal layer 13.

In the cross sections of the circuit layer 12 and the metal layer 13, the lower limit of the grain boundary length in the field of view of 1 mm$^2$ is preferably 12 mm or more, and more preferably 15 mm or more. In addition, in the cross sections of the circuit layer 12 and the metal layer 13, the upper limit of the grain boundary length in the field of view of 1 mm$^2$ is preferably 28 run or less, and more preferably 26 mm or less.

(Proportion of Twin Boundaries)

The strain when the temperature cycle is applied is accumulated in the normal grain boundaries, but not at the twin boundaries.

Therefore, in this embodiment, as a result of observing the cross sections of the circuit layer 12 and the metal layer 13 by the electron backscatter diffraction method, the proportion of twin boundaries represented by Σ3 grain boundaries is preferably limited to 50% or less.

The proportion of twin boundaries is more preferably 45% or less, and even more preferably 40% or less.

(Ratio of Surface Roughnesses Before and After Temperature Cycle Applied)

In the present embodiment, when the arithmetic average roughness of the surfaces of the circuit layer 12 and the metal layer 13 after conducting a temperature cycle test of holding at −45° C. for 30 minutes and holding at 250° C. for 30 minutes is defined as $Ra_1$, and the arithmetic average roughness of the surfaces of the circuit layer 12 and the metal layer 13 before conducting the temperature cycle test is defined as $Ra_0$, in a case where $Ra_1/Ra_0$ is in a range of 1.0 or more and 1.8 or less, the arithmetic average roughness of the surfaces of the circuit layer 12 and the metal layer 13 after conducting the temperature cycle test is not significantly increased from before conducting the temperature cycle test, and the occurrence of undulations is reliably suppressed.

$Ra_1/Ra_0$ is more preferably 1.7 or less, and even more preferably 1.6 or less.

Next, a production method of the insulating circuit board 10 which is the present embodiment described above will be described with reference to FIG. 2.

<Copper Plate Preparation Step S01>

First, copper plates which are to become the circuit layer 12 and the metal layer 13 are prepared. The copper plates are formed of a pure copper material having the above-mentioned composition. In the copper plates before bonding, the average crystal grain size is set to 10 μm or more and the aspect ratio (major axis/minor axis) of the crystal grains on rolled surfaces is set to 2 or less by changing heat treatment conditions and a rolling reduction when the copper plate is produced.

<Laminating Step S02>

Figure 2:
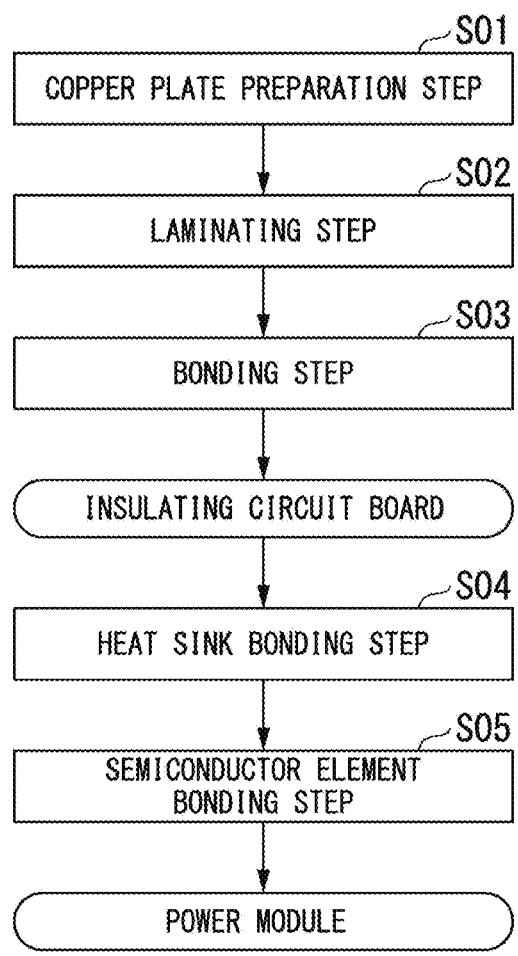
FIG. 2 is a flowchart showing the production method of the insulating circuit board which is the embodiment of the present invention.

Next, as shown in FIG. 2, the copper plate obtained as described above to become the circuit layer 12 is laminated on one surface of the ceramic substrate 11 with an active brazing material interposed therebetween, and the copper plate obtained as described above to become the metal layer 13 is laminated on the other surface of the ceramic substrate 11 with an active brazing material interposed therebetween.

In the present embodiment, a paste of Ag-28 mass % Cu-5 mass % Ti alloy was used as the active brazing material.

<Bonding Step S03>

The copper plate, the ceramic substrate 11, and the copper plate which are laminated are loaded into a vacuum heating furnace in a state of being pressed in the laminating direction, and heated, whereby the copper plate and the ceramic substrate 11 are bonded to each other to form the circuit layer 12 and the copper plate and the ceramic substrate 11 are bonded to each other to form the metal layer 13.

Here, the pressing load in the laminating direction is set to be in a range of 0.05 MPa or more and 1.5 MPa or less, the heating temperature is set to be in a range of 800° C. or higher and 850° C. or lower, and the holding time at the heating temperature is set to be in a range of 10 minutes or longer and 90 minutes or shorter. In addition, the pressure in the vacuum heating furnace at the heating temperature is preferably set to be in a range of $1.0 \times 10^{-4}$ Pa or more and $1.0 \times 10^{-1}$ Pa or less.

In addition, in the present embodiment, it is preferable to adjust the pressing load, the heating temperature, and the holding time so that an aspect ratio (major axis/minor axis) R0 of the crystal grains on the rolled surfaces of the copper plates before bonding, an aspect ratio (major axis/minor axis) R1 of the crystal grains on the rolled surfaces of the copper plates (circuit layer 12 and metal layer 13) after the bonding, and an average crystal grain size D1 on the rolled surfaces of the copper plates (circuit layer 12 and metal layer 13) after the bonding satisfy the following relational expression RD.

Relational expression $RD=D1 \times (R1/R0) \leq 500$

As described above, the insulating circuit board 10 according to the present embodiment is produced by the copper plate preparation step S01, the laminating step S02, and the bonding step S03.

(Heat Sink Bonding Step S04)

Next, the heat sink 51 is bonded to the other surface side of the metal layer 13 of the insulating circuit board 10.

In the present embodiment, the insulating circuit board 10 and the heat sink 51 are laminated with a solder material interposed therebetween and are loaded into a heating furnace such that the insulating circuit board 10 and the heat sink 51 are soldered to each other with the second solder layer 8 interposed therebetween.

(Semiconductor Element Bonding Step S05)

Next, the semiconductor element 3 is bonded to one surface of the circuit layer 12 of the insulating circuit board 10 by soldering.

The power module 1 shown in FIG. 1 is produced by the above steps.

According to the production method of the insulating circuit board 10 (copper/ceramic bonded body) of the present embodiment having the above configuration, since the amount of P in the copper plates forming the circuit layer 12 and the metal layer 13 is set to 2 mass ppm or less, the inhibition of the effect of the crystal grain growth suppressing elements present at the grain boundaries in a trace amount by P can be suppressed, and it is possible to suppress the coarsening and non-uniformity of the crystal grains in the copper plates (circuit layer 12 and metal layer 13) after bonding.

In addition, since elements such as Pb, Se, and Te have a low solid solubility limit in Cu and correspond to the crystal grain growth suppressing elements that suppress the coarsening of the crystal grains by segregation at the grain boundaries, the elements may be contained in a trace amount. However, these elements also have an effect of greatly reducing hot workability. Therefore, hot workability can be secured by limiting the total content of Pb, Se, and Te to 10 mass ppm or less. Therefore, it is possible to stably produce the copper plates which are to become the circuit layer 12 and the metal layer 13.

Furthermore, in the present embodiment, since the average crystal grain size of the copper plates before bonding is set to 10 μm or more and the aspect ratio (major axis/minor axis) of the crystal grains on the rolled surfaces is set to 2 or less, a large strain is not accumulated in the copper plates before bonding, the driving force for recrystallization becomes smaller, and in the subsequent bonding step S03, the local coarsening of the crystal grains can be suppressed even if the bonding is performed under the conditions that the pressing load in the laminating direction is in a range of 0.05 MPa or more and 1.5 MPa or less, the heating temperature is in a range of 800° C. or higher and 850° C. or lower, and the holding time at the heating temperature is in a range of 10 minutes or longer and 90 minutes or shorter.

Therefore, it is possible to suppress the coarsening and non-uniformity of the crystal grains in the copper plates (circuit layer 12 and metal layer 13) after bonding.

In addition, in the present embodiment, since the pressing load, heating temperature, and holding time in the bonding step S03 are adjusted so that the aspect ratio (major axis/minor axis) R0 of the crystal grains on the rolled surfaces of the copper plates before the bonding, the aspect ratio R1 of the crystal grains on the rolled surfaces of the copper plates (circuit layer 12 and metal layer 13) after the bonding, and the average crystal grain size D1 on the rolled surfaces of the copper plates (circuit layer 12 and metal layer 13) after the bonding satisfy the relational expression $RD=D1 \times (R1/R0) \leq 500$, the local coarsening of the crystal grains in the copper plates (circuit layer 12 and metal layer 13) after the bonding can be reliably suppressed.

Furthermore, in the present embodiment, in a case where the S content in the copper plates forming the circuit layer 12 and the metal layer 13 is set to be in a range of 2 mass ppm or more and 20 mass ppm or less, it is possible to reliably suppress the coarsening and non-uniformity of the crystal grains in the copper plates (circuit layer 12 and metal layer 13) after the bonding by P, which is a crystal grain growth suppressing element.

Moreover, in the present embodiment, in a case where the total content of Mg, Sr, Ba, Ti, Zr, Hf, and Y in the copper plates forming the circuit layer 12 and the metal layer 13 is 10 mass ppm or less, the generation of compounds of these elements with S, Se, Te, and the like, which are crystal grain growth suppressing elements, and consumption of S, Se, Te, and the like can be suppressed, and the crystal grain growth suppressing effect by the crystal grain growth suppressing elements can be sufficiently exhibited. Therefore, even after the bonding, it is possible to reliably suppress the coarsening and non-uniformity of the crystal grains.

In the insulating circuit board 10 of the present embodiment, in the cross sections of the circuit layer 12 and the metal layer 13, since the maximum area ratio when the crystal orientation map of copper obtained by EBSD is trisected into (001) planes, (111) planes, and (101) planes is set to 45% or less and the grain boundary length in a field of view of 1 mm$^2$ is set to 10 mm or more and less than 30 mm, even in a case where a temperature cycle is applied, the accumulation of strain in the circuit layer 12 and the metal layer 13 and the occurrence of undulations on the surfaces of the circuit layer 12 and the metal layer 13 can be suppressed.

In addition, in the present embodiment, as a result of observing the cross sections of the circuit layer 12 and the metal layer 13 by the electron backscatter diffraction method, in a case where the proportion of twin boundaries represented by Σ3 grain boundaries is 50% or less, in the circuit layer 12 and the metal layer 13, the proportion of normal grain boundaries is secured in the copper plate, strain can be accumulated in the normal grain boundaries when a temperature cycle is applied, and the occurrence of undulations on the surfaces of the circuit layer 12 and the metal layer 13 can be more accurately suppressed.

Furthermore, in the present embodiment, in a case where $Ra_1/Ra_0$ is in a range of 1.0 or more and 1.8 or less when the arithmetic average roughness of the surfaces of the circuit layer 12 and the metal layer 13 after conducting a temperature cycle test of holding at −45° C. for 30 minutes and holding at 250° C. for 30 minutes is defined as $Ra_1$, and the arithmetic average roughness of the surfaces of the circuit layer 12 and the metal layer 13 before conducting the temperature cycle test is defined as $Ra_0$, the surface roughness of the circuit layer 12 and the metal layer 13 is not significantly increased even after conducting the temperature cycle test, and it is possible to reliably suppress the occurrence of undulations.

While the embodiments of the present invention have been described above, the present invention is not limited thereto and can be modified as appropriate without departing from the technical spirit of the invention.

For example, although the circuit layer and the metal layer have been described as being formed of the copper plates made of the pure copper material described above, the circuit layer and the metal layer are not limited thereto. As long as at least one of the circuit layer and the metal layer is formed of the copper plate made of the pure copper material, the other may be formed of another copper or copper alloy, aluminum or an aluminum alloy, a laminate thereof, or the like.

Furthermore, in the present embodiment, although the ceramic substrate has been described as being made of silicon nitride, the ceramic substrate is not limited thereto. The ceramic substrate may be made of aluminum nitride or aluminum oxide.

In addition, in the present embodiment, the copper plate and the ceramic substrate have been described as being bonded by using an active brazing material, the copper plate and the ceramic substrate may be bonded by another bonding method such as a DBC method. In addition, although it has been described that the paste of Ag-28 mass % Cu-5 mass % Ti alloy is used as the active brazing material, an active brazing material having another composition may also be applied.

Furthermore, in the present embodiment, configurating the power module by mounting the power semiconductor element on the circuit layer of the insulating circuit board has been described, but the present embodiment is not limited thereto. For example, an LED module may be configured by mounting an LED element on the insulating circuit board, or a thermoelectric module may be configured by mounting a thermoelectric element on the circuit layer of the insulating circuit board.

EXAMPLES

A confirmatory experiment performed to confirm effectiveness of the present invention will be described.

Example 1

Cu materials with different compositions, initial grain sizes, and aspect ratios were obtained and used as copper strip materials for a circuit layer and a metal layer for an insulating board.

Next, copper plates (37 mm square, thickness 0.8 mm) to be the circuit layer and the metal layer were prepared by cutting the above-mentioned copper strip material, and were bonded to both surfaces of a 40 mm square ceramic substrate made of silicon nitride (thickness 0.32 mm) using an active brazing material of an Ag-28 mass % Cu-5 mass % Ti alloy under the conditions shown in Tables 3 and 4, whereby copper/ceramic bonded bodies were formed. In addition, the degree of vacuum of a vacuum furnace during bonding was set to $5\times10^{-3}$ Pa.

The copper strip materials (copper plates) and copper/ceramic bonded bodies thus obtained were evaluated for the following items.

(Crystal Grain Size of Copper Plate Before Bonding)

A 20 mm×20 mm sample was cut out from the obtained copper strip material, and the average crystal grain size was measured by a SEM-EBSD (Electron Backscatter Diffraction Patterns) measuring device.

A rolled surface was mechanically polished using water-resistant abrasive paper and diamond abrasive grains, and then subjected to finish polishing using a colloidal silica solution. Thereafter, using an electron scanning microscope, each measurement point (pixel) within a measurement range on the surface of a specimen was irradiated with an electron beam, and a grain boundary having an orientation difference of 150 or more between adjacent measurement points was defined as a high-angle grain boundary by orientation analysis according to backscatter electron diffraction, while a grain boundary having an orientation difference of less than 15° was defined as a low-angle grain boundary.

A crystal grain boundary map was creased using high-angle grain boundaries, five line segments of predetermined length and width were drawn on the crystal grain boundary map according to a cutting method of JIS H 0501, the number of completely cut crystal grains was counted, and the average value of the cutting lengths was described as the crystal grain size before bonding. The evaluation results are shown in Tables 3 and 4.

(Aspect Ratio R0 of Crystal Grains of Copper Plate Before Bonding)

For the aspect ratio (major axis/minor axis) of the crystal grains on the rolled surface, a crystal grain boundary map of the rolled surface of the obtained copper strip material was produced using the SEM-EBSD (Electron Backscatter Diffraction Patterns) measuring device in the same manner as described above. For the map, five line segments were drawn in the plate thickness direction, five line segments were drawn in the rolling direction, the number of completely cut crystal grains was counted, the ratio of the major axis to the minor axis was taken as the aspect ratio (major axis/minor axis), and the average value thereof was calculated. The evaluation results are shown in Tables 3 and 4.

(Crystal Grain Size D1 of Copper Plate after Bonding)

A 30 mm×30 mm sample was cut out from the copper plate bonded to the ceramic substrate, the rolled surface was mirror-polished, etched, and photographed with an optical microscope so that the rolling direction was a width direction in the photograph. In the observation sites, ten fields of views were selected as sites in which a uniform grain size was formed in a field of view of about 1000×1000 µm$^2$, and observation and measurement were performed in about 1000×1000 µm$^2$. Then, regarding the crystal grain size, according to the cutting method of JIS H 0501, five line segments of predetermined length and width were drawn in the photograph, the number of completely cut crystal grains was counted, and the average value of the cutting lengths was described as the crystal grain size after a heat treatment. Those having an average crystal grain size after bonding of 400 µm or less were indicated as "O", and those of more than 400 µm were indicated as "X". The evaluation results are shown in Tables 3 and 4.

(Aspect Ratio R1 of Crystal Grains of Copper Plate after Bonding)

As described above, a crystal grain boundary map of the rolled surface of the sample collected from the copper plate bonded to the ceramic substrate was produced using the SEM-EBSD (Electron Backscatter Diffraction Patterns) measuring device in the same manner as described above. For the map, five line segments were drawn in the plate thickness direction, five line segments were drawn in the rolling direction, the number of completely cut crystal grains was counted, the ratio of the major axis to the minor axis was taken as the aspect ratio (major axis/minor axis), and the average value thereof was calculated. The evaluation results are shown in Tables 3 and 4.

(Variation of Grain Size of Copper Plate after Bonding)

As described above, for the sample collected from the copper plate bonded to the ceramic substrate, in a range of 30 mm×30 mm excluding twins, the average value of the major axis of the coarsest crystal grain and the minor axis cut by the grain boundary when a line was drawn perpendicular thereto was defined as the maximum crystal grain size $d_{max}$, a case where the ratio $d_{max}/d_{ave}$ of the maximum crystal grain size $d_{max}$ to the above-described average crystal grain size $d_{ave}$ was 10 or less was evaluated as "O", and a case where $d_{max}/d_{ave}$ exceeded 10 was evaluated as "X". The evaluation results are shown in Tables 3 and 4.

(Ratio of Crystal Orientations in Crystal Orientation Map by EBSD)

Crystal orientation ratio of copper: After bonding the ceramic substrate and the copper plate, a cross section of a copper plate portion of a ceramic circuit board was prepared at an arbitrary position, a crystal orientation map of the copper plate portion in the field of view was created by performing electron backscatter analysis (EBSD: AMETEK Inc., Hikari detector/SEM: ZEISS, Ultra 55) under the condition of an accelerating voltage of 15 kV, the crystal orientations of copper were then three-valued into (001) planes, (111) planes, and (101) planes, and the ratio of planes showing the highest value from the area ratios of the orientations was evaluated as the crystal orientation ratio.

(Grain Boundary Length/Proportion of Twin Boundaries)

From the above cross-sectional analysis results, the total grain boundary lengths of 1 mm of the copper plate portion were measured using OIM-data-collection software. In addition, the proportion of the grain boundaries corresponding to 3E to the total grain boundaries was defined as the proportion of twin boundaries.

(Surface Roughnesses Before and After Temperature Cycle Test)

The plating surface roughness Ra after plating the copper plate after conducting 1000 thermal cycle tests under the conditions of a holding time of 30 minutes at 250° C. and a holding time of 30 minutes at −45° C. was evaluated using a contact type surface roughness meter (201P manufactured by Mitutoyo Corporation.

TABLE 1

| | | Component composition (mass ratio) | | | | | | | | | | | | | |
|---|---|---|---|---|---|---|---|---|---|---|---|---|---|---|---|
| | | Cu % | P ppm | Three elements in total ppm | Pb ppm | Se ppm | Te ppm | S ppm | Seven elements in total ppm | Mg ppm | Sr ppm | Ba ppm | Ti ppm | Zr ppm | Hf ppm | Y ppm |
| Present Invention Example | 1 | 99.96 or more | 0.9 | 5.0 | 2.5 | 0.2 | 2.3 | 5.5 | 4.6 | 0.6 | 0.5 | 0.2 | 2.0 | 0.6 | 0.5 | 0.2 |
| | 2 | 99.96 or more | 0.3 | 3.2 | 1.7 | 1.2 | 0.3 | 16.6 | 5.3 | 2.0 | 0.5 | 0.2 | 0.9 | 0.7 | 0.4 | 0.6 |
| | 3 | 99.96 or more | 0.8 | 4.6 | 1.2 | 2.5 | 0.9 | 7.9 | 3.8 | 0.8 | 0.5 | 0.1 | 0.5 | 0.5 | 0.5 | 0.9 |
| | 4 | 99.96 or more | 0.8 | 5.6 | 2.1 | 1.3 | 2.2 | 4.9 | 5.7 | 2.6 | 0.3 | 0.2 | 1.1 | 0.1 | 0.8 | 0.6 |
| | 5 | 99.96 or more | 1.8 | 5.6 | 2.1 | 1.3 | 2.2 | 4.9 | 5.7 | 2.6 | 0.3 | 0.2 | 1.1 | 0.1 | 0.8 | 0.6 |
| | 6 | 99.96 or more | 1.8 | 5.6 | 2.1 | 1.3 | 2.2 | 4.9 | 5.7 | 2.6 | 0.3 | 0.2 | 1.1 | 0.1 | 0.8 | 0.6 |
| | 7 | 99.96 or more | 0.7 | 6.3 | 2.6 | 2.9 | 0.8 | 19.7 | 6.6 | 2.8 | 0.5 | 0.4 | 0.9 | 0.9 | 0.3 | 0.8 |
| | 8 | 99.96 or more | 0.9 | 2.4 | 0.2 | 1.2 | 1.0 | 4.8 | 5.2 | 1.1 | 0.3 | 0.2 | 1.8 | 0.2 | 0.7 | 0.9 |
| | 9 | 99.96 or more | 1.8 | 4.3 | 0.4 | 1.9 | 2.0 | 15.5 | 4.1 | 0.4 | 0.4 | 0.5 | 1.7 | 0.7 | 0.2 | 0.2 |
| | 10 | 99.96 or more | 1.0 | 5.7 | 2.8 | 1.1 | 1.8 | 12.6 | 6.9 | 3.0 | 0.3 | 0.1 | 2.0 | 0.4 | 1.0 | 0.1 |
| | 11 | 99.96 or more | 1.9 | 3.2 | 0.4 | 2.5 | 0.3 | 19.4 | 6.7 | 2.4 | 0.3 | 0.5 | 1.7 | 0.1 | 0.7 | 1.0 |
| | 12 | 99.96 or more | 2.0 | 6.8 | 2.8 | 2.1 | 1.9 | 15.7 | 5.3 | 1.6 | 0.4 | 0.5 | 1.2 | 0.6 | 0.7 | 0.3 |
| | 13 | 99.96 or more | 2.0 | 6.8 | 2.8 | 2.1 | 1.9 | 15.7 | 5.3 | 1.6 | 0.4 | 0.5 | 1.2 | 0.6 | 0.7 | 0.3 |
| | 14 | 99.96 or more | 2.0 | 6.8 | 2.8 | 2.1 | 1.9 | 15.7 | 5.3 | 1.6 | 0.4 | 0.5 | 1.2 | 0.6 | 0.7 | 0.3 |

TABLE 1-continued

| | | Component composition (mass ratio) | | | | | | | | | | | | | |
|---|---|---|---|---|---|---|---|---|---|---|---|---|---|---|---|
| | Cu % | P ppm | Three elements in total ppm | Pb ppm | Se ppm | Te ppm | S ppm | Seven elements in total ppm | Mg ppm | Sr ppm | Ba ppm | Ti ppm | Zr ppm | Hf ppm | Y ppm |
| 15 | 99.96 or more | 0.7 | 5.8 | 1.1 | 3.0 | 1.7 | 13.8 | 5.3 | 1.5 | 0.5 | 0.4 | 0.8 | 1.0 | 1.0 | 0.1 |
| 16 | 99.96 or more | 0.3 | 4.4 | 2.6 | 0.7 | 1.1 | 2.1 | 7.0 | 3.0 | 0.5 | 0.5 | 1.3 | 1.0 | 0.2 | 0.5 |
| 17 | 99.96 or more | 1.0 | 4.3 | 1.0 | 2.6 | 0.7 | 14.2 | 6.5 | 2.5 | 0.4 | 0.3 | 1.9 | 0.6 | 0.2 | 0.6 |
| 18 | 99.96 or more | 1.8 | 6.2 | 2.7 | 1.3 | 2.2 | 13.4 | 4.4 | 0.9 | 0.3 | 0.3 | 1.1 | 1.0 | 0.3 | 0.5 |
| 19 | 99.96 or more | 0.1 | 3.2 | 0.4 | 0.2 | 2.6 | 16.2 | 3.9 | 1.5 | 0.2 | 0.1 | 0.4 | 0.3 | 0.9 | 0.5 |
| 20 | 99.96 or more | 0.9 | 2.0 | 0.2 | 1.5 | 0.3 | 18.8 | 4.5 | 1.4 | 0.2 | 0.1 | 1.4 | 0.4 | 0.2 | 0.8 |
| 21 | 99.96 or more | 1.2 | 6.7 | 2.2 | 2.8 | 1.7 | 9.0 | 3.9 | 0.4 | 0.1 | 0.4 | 1.2 | 0.9 | 0.8 | 0.1 |
| 22 | 99.96 or more | 1.2 | 4.2 | 1.9 | 1.2 | 1.1 | 18.5 | 5.7 | 1.4 | 0.1 | 0.4 | 1.8 | 0.9 | 1.0 | 0.1 |

TABLE 2

| | | | Component composition (mass ratio) | | | | | | | | | | | | | |
|---|---|---|---|---|---|---|---|---|---|---|---|---|---|---|---|---|
| | | Cu % | P ppm | Three elements in total ppm | Pb ppm | Se ppm | Te ppm | S ppm | Seven elements in total ppm | Mg ppm | Sr ppm | Ba ppm | Ti ppm | Zr ppm | Hf ppm | Y ppm |
| Present Invention Example | 23 | 99.96 or more | 1.5 | 4.0 | 2.2 | 0.9 | 0.9 | 19.9 | 4.8 | 1.1 | 0.2 | 0.3 | 1.1 | 0.9 | 1.0 | 0.2 |
| | 24 | 99.96 or more | 1.8 | 2.3 | 0.4 | 0.2 | 1.7 | 19.3 | 1.5 | 0.2 | 0.2 | 0.2 | 0.2 | 0.1 | 0.5 | 0.1 |
| | 25 | 99.96 or more | 0.2 | 4.0 | 1.6 | 1.0 | 1.4 | 14.1 | 5.4 | 1.6 | 0.4 | 0.2 | 0.7 | 0.8 | 0.8 | 0.9 |
| | 26 | 99.96 or more | 0.6 | 5.4 | 1.4 | 1.6 | 2.4 | 10.4 | 3.8 | 0.3 | 0.2 | 0.5 | 1.3 | 0.6 | 0.3 | 0.6 |
| | 27 | 99.96 or more | 1.8 | 3.3 | 2.4 | 0.5 | 0.4 | 18.5 | 2.9 | 0.5 | 0.3 | 0.3 | 0.4 | 0.4 | 0.2 | 0.8 |
| | 28 | 99.96 or more | 1.3 | 5.7 | 1.6 | 1.5 | 2.6 | 17.5 | 4.8 | 1.9 | 0.1 | 0.3 | 0.8 | 0.1 | 0.9 | 0.7 |
| | 29 | 99.96 or more | 1.3 | 5.7 | 1.6 | 1.5 | 2.6 | 17.5 | 4.8 | 1.9 | 0.1 | 0.3 | 0.8 | 0.1 | 0.9 | 0.7 |
| | 30 | 99.96 or more | 1.3 | 5.7 | 1.6 | 1.5 | 2.6 | 17.5 | 4.8 | 1.9 | 0.1 | 0.3 | 0.8 | 0.1 | 0.9 | 0.7 |
| | 31 | 99.96 or more | 0.1 | 1.1 | 0.8 | 0.2 | 0.1 | 4.0 | 0.4 | 0.1 | 0.0 | 0.0 | 0.1 | 0.0 | 0.1 | 0.1 |
| | 32 | 99.96 or more | 0.2 | 1.6 | 1.2 | 0.3 | 0.1 | 4.0 | 0.7 | 0.2 | 0.1 | 0.0 | 0.1 | 0.2 | 0.1 | 0.0 |
| Comparative Example | 1 | 99.96 or more | 5.0 | 6.8 | 0.8 | 3.0 | 3.0 | 14.1 | 12.1 | 5.0 | 1.2 | 3.0 | 1.6 | 0.3 | 0.5 | 0.5 |
| | 2 | 99.96 or more | 1.6 | 23.5 | 4.2 | 9.8 | 9.5 | 2.0 | 2.2 | 1.0 | 0.4 | 0.2 | 0.1 | 0.3 | 0.1 | 0.1 |
| | 3 | 99.96 or more | 1.8 | 22.7 | 2.8 | 10.3 | 9.6 | 17.0 | 4.0 | 1.3 | 0.8 | 0.5 | 0.5 | 0.4 | 0.3 | 0.2 |
| | 4 | 99.96 or more | 1.7 | 6.8 | 1.9 | 2.1 | 2.8 | 10.5 | 5.3 | 2.6 | 0.3 | 0.1 | 1.4 | 0.3 | 0.1 | 0.5 |
| | 5 | 99.96 or more | 0.1 | 5.3 | 2.6 | 1.9 | 0.8 | 6.3 | 3.7 | 0.7 | 0.1 | 0.4 | 1.3 | 0.6 | 0.1 | 0.5 |
| | 6 | 99.96 or more | 0.5 | 4.9 | 2.4 | 0.5 | 2.0 | 14.5 | 7.0 | 3.0 | 0.4 | 0.3 | 1.6 | 0.4 | 0.8 | 0.5 |
| | 7 | 99.96 or more | 1.6 | 5.3 | 2.1 | 2.4 | 0.8 | 11.8 | 3.3 | 0.1 | 0.1 | 0.4 | 0.4 | 0.7 | 0.9 | 0.7 |
| | 8 | 99.96 or more | 0.5 | 4.6 | 2.0 | 0.9 | 1.7 | 11.6 | 5.8 | 2.6 | 0.4 | 0.1 | 1.9 | 0.2 | 0.1 | 0.5 |
| | 9 | 99.96 or more | 0.5 | 4.0 | 0.5 | 0.7 | 2.8 | 11.6 | 4.7 | 2.7 | 0.1 | 0.2 | 0.5 | 0.5 | 0.2 | 0.5 |

45

TABLE 3

| | | Before heat treatment | | Bonding step | | | After bonding | | | | |
|---|---|---|---|---|---|---|---|---|---|---|---|
| | | | | | | | Crystal | | | | |
| | | Crystal grain size μm | Aspect ratio R0 | Pressing load MPa | Heating temperature ° C. | Holding time min | grain size D1 μm | Aspect ratio R1 | R1/R0 | Relational expression RD | Variation in crystal grain size |
| Present Invention Example | 1 | 12 | 1.087 | 0.1 | 840 | 30 | 135 | 1.022 | 0.94 | 127 | ○ |
| | 2 | 14 | 1.163 | 0.1 | 840 | 30 | 230 | 1.041 | 0.90 | 206 | ○ |
| | 3 | 10 | 1.087 | 0.1 | 840 | 30 | 160 | 1.022 | 0.94 | 150 | ○ |
| | 4 | 10 | 1.163 | 0.1 | 840 | 30 | 250 | 1.041 | 0.90 | 224 | ○ |
| | 5 | 10 | 1.163 | 0.2 | 840 | 30 | 280 | 1.038 | 0.90 | 251 | ○ |
| | 6 | 10 | 1.163 | 1.0 | 840 | 30 | 340 | 1.035 | 0.90 | 304 | ○ |
| | 7 | 12 | 1.111 | 0.1 | 840 | 30 | 200 | 1.028 | 0.93 | 185 | ○ |
| | 8 | 11 | 1.000 | 0.1 | 840 | 30 | 160 | 1.000 | 1.00 | 160 | ○ |
| | 9 | 12 | 1.176 | 0.1 | 840 | 30 | 140 | 1.044 | 0.89 | 124 | ○ |
| | 10 | 12 | 1.389 | 0.1 | 840 | 30 | 200 | 1.097 | 0.79 | 158 | ○ |
| | 11 | 15 | 1.000 | 0.1 | 840 | 30 | 120 | 1.000 | 1.00 | 120 | ○ |

TABLE 3-continued

| | | Before heat treatment | | Bonding step | | | After bonding Crystal | | | | |
|---|---|---|---|---|---|---|---|---|---|---|---|
| | | Crystal grain size μm | Aspect ratio R0 | Pressing load MPa | Heating temperature °C. | Holding time min | grain size D1 μm | Aspect ratio R1 | R1/R0 | Relational expression RD | Variation in crystal grain size |
| | 12 | 14 | 1.064 | 0.1 | 840 | 30 | 210 | 1.016 | 0.96 | 201 | ○ |
| | 13 | 14 | 1.064 | 0.2 | 840 | 30 | 230 | 1.013 | 0.96 | 220 | ○ |
| | 14 | 14 | 1.064 | 1.0 | 840 | 30 | 260 | 1.019 | 0.96 | 248 | ○ |
| | 15 | 16 | 1.163 | 0.1 | 840 | 30 | 180 | 1.041 | 0.90 | 161 | ○ |
| | 16 | 18 | 1.449 | 0.1 | 840 | 30 | 140 | 1.112 | 0.77 | 107 | ○ |
| | 17 | 19 | 1.000 | 0.1 | 840 | 30 | 190 | 1.000 | 1.00 | 190 | ○ |
| | 18 | 17 | 1.064 | 0.1 | 840 | 30 | 160 | 1.016 | 0.96 | 153 | ○ |
| | 19 | 16 | 1.163 | 0.1 | 840 | 30 | 130 | 1.041 | 0.90 | 116 | ○ |
| | 20 | 19 | 1.408 | 0.1 | 840 | 30 | 186 | 1.102 | 0.78 | 146 | ○ |
| | 21 | 31 | 1.000 | 0.1 | 840 | 30 | 135 | 1.000 | 1.00 | 135 | ○ |
| | 22 | 30 | 1.087 | 0.1 | 840 | 30 | 230 | 1.022 | 0.94 | 216 | ○ |

TABLE 4

| | | Before heat treatment | | Bonding step | | | After bonding Crystal | | | | |
|---|---|---|---|---|---|---|---|---|---|---|---|
| | | Crystal grain size μm | Aspect ratio R0 | Pressing load MPa | Heating temperature °C. | Holding time min | grain size D1 μm | Aspect ratio R1 | R1/R0 | Relational expression RD | Variation in crystal grain size |
| Present Invention Example | 23 | 28 | 1.190 | 0.1 | 840 | 30 | 280 | 1.048 | 0.88 | 246 | ○ |
| | 24 | 32 | 1.429 | 0.1 | 840 | 30 | 275 | 1.107 | 0.78 | 213 | ○ |
| | 25 | 41 | 1.000 | 0.1 | 840 | 30 | 220 | 1.000 | 1.00 | 220 | ○ |
| | 26 | 43 | 1.064 | 0.1 | 840 | 30 | 210 | 1.016 | 0.96 | 201 | ○ |
| | 27 | 39 | 1.190 | 0.1 | 840 | 30 | 130 | 1.048 | 0.88 | 114 | ○ |
| | 28 | 59 | 1.818 | 0.1 | 840 | 30 | 290 | 1.105 | 0.61 | 176 | ○ |
| | 29 | 59 | 1.818 | 0.2 | 840 | 30 | 300 | 1.095 | 0.61 | 182 | ○ |
| | 30 | 59 | 1.818 | 1.0 | 840 | 30 | 310 | 1.123 | 0.61 | 188 | ○ |
| | 31 | 80 | 1.054 | 0.1 | 840 | 30 | 120 | 1.050 | 1.00 | 120 | ○ |
| | 32 | 71 | 1.081 | 0.1 | 840 | 30 | 115 | 1.061 | 0.98 | 113 | ○ |
| Comparative example | 1 | 8 | 2.778 | 0.1 | 840 | 30 | 600 | 1.944 | 0.70 | 420 | X |
| | 2 | 15 | 1.563 | 0.1 | 840 | 30 | 210 | 1.400 | 0.90 | 188 | X |
| | 3 | 20 | 1.778 | 0.1 | 840 | 30 | 250 | 1.300 | 0.73 | 183 | X |
| | 4 | 10 | 1.163 | 2.0 | 840 | 30 | 680 | 1.041 | 0.90 | 609 | ○ |
| | 5 | 14 | 1.064 | 2.0 | 840 | 30 | 720 | 1.016 | 0.96 | 688 | ○ |
| | 6 | 59 | 1.818 | 2.0 | 840 | 30 | 930 | 1.205 | 0.66 | 616 | ○ |
| | 7 | 4 | 1.645 | 0.1 | 840 | 30 | 843 | 1.398 | 0.85 | 717 | ○ |
| | 8 | 8 | 1.453 | 0.1 | 840 | 30 | 726 | 1.235 | 0.85 | 617 | ○ |
| | 9 | 3 | 1.243 | 0.1 | 840 | 30 | 868 | 1.057 | 0.85 | 738 | ○ |

TABLE 5

| | | Crystal orientation map | | | Grain boundary length in field of view of 1 mm² mm | Proportion of twin boundaries % | Temperature cycle test $Ra_1/Ra_0$ |
|---|---|---|---|---|---|---|---|
| | | Ratio of (001) planes % | Ratio of (111) planes % | Ratio of (101) planes % | | | |
| Present Invention Example | 1 | 26 | 30 | 44 | 23 | 48 | 1.3 |
| | 2 | 30 | 43 | 27 | 11 | 11 | 1.3 |
| | 3 | 44 | 28 | 28 | 11 | 14 | 1.7 |
| | 4 | 41 | 41 | 18 | 26 | 47 | 1.4 |
| | 5 | 42 | 36 | 22 | 27 | 12 | 1.3 |

TABLE 5-continued

| | | Crystal orientation map | | Grain boundary length in | | |
|---|---|---|---|---|---|---|
| | Ratio of (001) planes % | Ratio of (111) planes % | Ratio of (101) planes % | field of view of 1 mm² mm | Proportion of twin boundaries % | Temperature cycle test Ra₁/Ra₀ |
| 6 | 31 | 34 | 35 | 13 | 22 | 1.3 |
| 7 | 37 | 42 | 21 | 27 | 20 | 1.0 |
| 8 | 36 | 33 | 31 | 21 | 18 | 1.4 |
| 9 | 43 | 43 | 14 | 18 | 45 | 1.1 |
| 10 | 22 | 39 | 39 | 26 | 23 | 1.1 |
| 11 | 44 | 34 | 22 | 25 | 29 | 1.1 |
| 12 | 44 | 34 | 22 | 18 | 37 | 1.6 |
| 13 | 31 | 33 | 36 | 21 | 14 | 1.8 |
| 14 | 22 | 33 | 45 | 16 | 23 | 1.7 |
| 15 | 25 | 42 | 33 | 14 | 41 | 1.1 |
| 16 | 27 | 41 | 32 | 26 | 20 | 1.5 |
| 17 | 34 | 39 | 27 | 22 | 31 | 1.7 |
| 18 | 23 | 36 | 41 | 24 | 37 | 1.7 |
| 19 | 30 | 38 | 32 | 12 | 27 | 1.7 |
| 20 | 27 | 44 | 29 | 26 | 38 | 1.3 |
| 21 | 32 | 37 | 31 | 29 | 36 | 1.0 |
| 22 | 25 | 34 | 41 | 26 | 41 | 1.1 |

TABLE 6

| | | | Crystal orientation map | | Grain boundary length in | | |
|---|---|---|---|---|---|---|---|
| | | Ratio of (001) planes % | Ratio of (111) planes % | Ratio of (101) planes % | field of view of 1 mm² mm | Proportion of twin boundaries % | Temperature cycle test Ra₁/Ra₀ |
| Present Invention Example | 23 | 44 | 34 | 22 | 20 | 24 | 1.5 |
| | 24 | 32 | 39 | 29 | 11 | 30 | 1.0 |
| | 25 | 27 | 35 | 38 | 26 | 15 | 1.2 |
| | 26 | 39 | 36 | 25 | 20 | 32 | 1.8 |
| | 27 | 40 | 35 | 25 | 20 | 32 | 1.6 |
| | 28 | 39 | 36 | 25 | 24 | 28 | 1.6 |
| | 29 | 31 | 35 | 34 | 16 | 34 | 1.1 |
| | 30 | 25 | 37 | 38 | 29 | 25 | 1.8 |
| | 31 | 37 | 35 | 28 | 20 | 36 | 1.3 |
| | 32 | 29 | 40 | 31 | 25 | 17 | 1.4 |
| Comparative Example | 1 | 60 | 22 | 18 | 29 | 39 | 2.1 |
| | 2 | 12 | 80 | 8 | 20 | 18 | 2.9 |
| | 3 | 10 | 14 | 76 | 25 | 41 | 2.8 |
| | 4 | 36 | 33 | 31 | 8 | 33 | 2.0 |
| | 5 | 29 | 40 | 31 | 32 | 44 | 2.4 |
| | 6 | 62 | 10 | 28 | 20 | 51 | 2.4 |
| | 7 | 6 | 33 | 61 | 11 | 58 | 3.1 |
| | 8 | 26 | 48 | 26 | 13 | 62 | 2.2 |
| | 9 | 33 | 42 | 25 | 6 | 55 | 2.0 |

In Comparative Example 1, since the amount of P was larger than the range of the present invention, the average crystal grain size of the copper plate after bonding was as coarse as 600 μm, and the variation in the crystal grain size was large.

In Comparative Examples 2 and 3, the total content of Pb, Se, and Te was larger than the range of the present invention, and the variation in the crystal grain size of the copper plate after bonding was large.

Figure 4A:
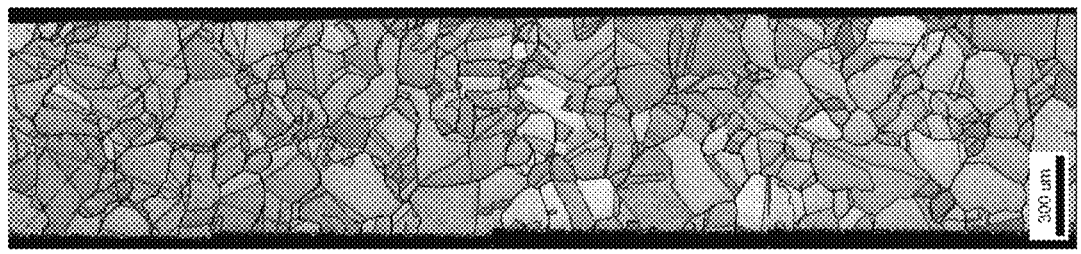
FIG. 4A is a diagram showing the results of measuring the grain boundary lengths of a cross section of a circuit layer in an example (Present Invention Example 16).
Figure 4B:
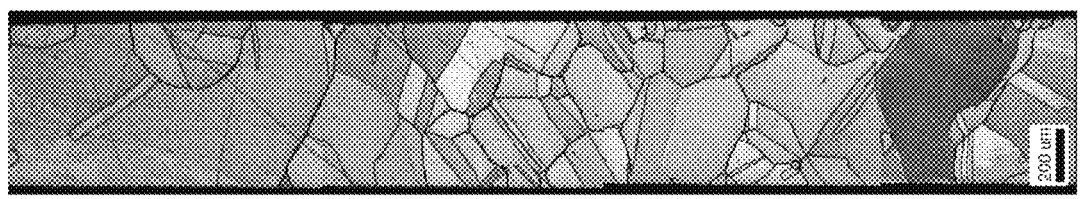
FIG. 4B is a diagram showing the results of measuring the grain boundary lengths of a cross section of a circuit layer in an example (Comparative Example 4).

In Comparative Examples 4 to 6, since the pressing load in the bonding step was as large as 2 MPa, the RD value was large, and the average crystal grain size of the copper plate after bonding was coarse (see FIG. 4B for Comparative Example 4).

In Comparative Examples 7 to 9, since the crystal grain size of the Cu strip material before bonding was too small, grain growth was promoted during bonding, and the average crystal grain size was coarse.

On the other hand, in Present Invention Examples 1 to 32 in which the amount of P was 2 mass ppm or less, the total content of Pb, Se, and Te was set to 10 mass ppm or less, and the bonding conditions were set to be in the ranges of the present invention, the average crystal grain of the copper plate after bonding was small, and the variation in the crystal grain size was small.

Figure 3A:
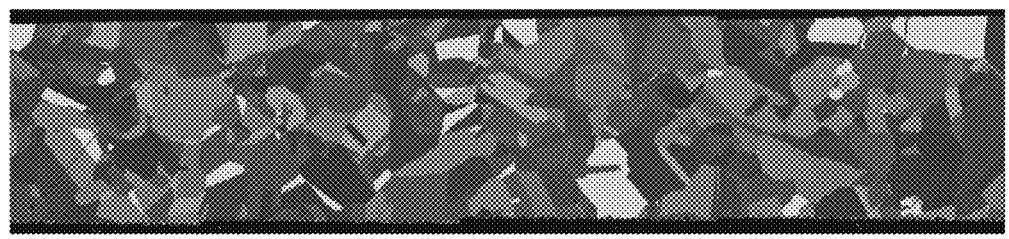
FIG. 3A is a diagram of a crystal orientation map of copper obtained by EBSD in a cross section of a circuit layer in an example (Present Invention Example 21).
Figure 3A:
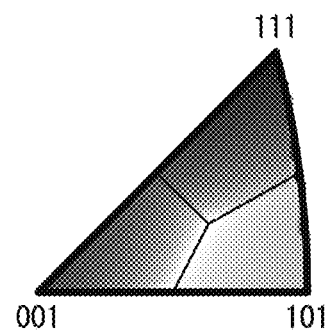
Figure 3B:
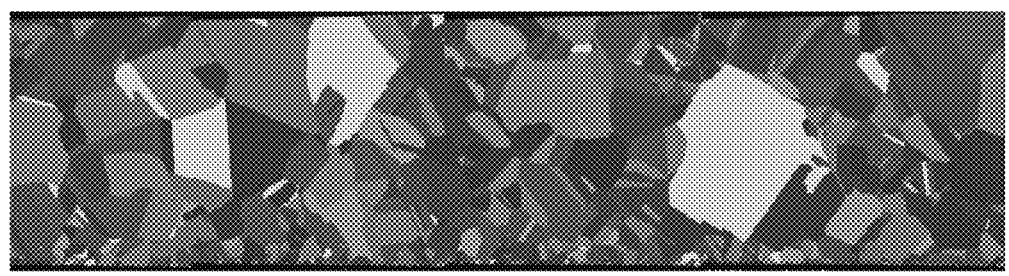
FIG. 3B is a diagram of a crystal orientation map of copper obtained by EBSD in a cross section of a circuit layer in an example (Comparative Example 9).
Figure 3B:
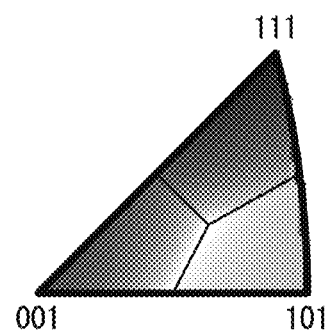

In addition, in Comparative Examples 1 to 3 and 6 to 8, the maximum area ratio when the crystal orientation map of copper obtained by EBSD in the cross section of the copper plate was trisected into (001) planes, (111) planes, and (101) planes exceeded 45%, and the surface roughness after the temperature cycle test was large (see FIG. 3B for Comparative Example 9).

In Comparative Examples 4 and 9, the grain boundary length in a field of view of 1 mm² in the cross section of the copper member was less than 10 mm, and the surface roughness after the temperature cycle test was large (see FIG. 4B for Comparative Example 4).

In Comparative Example 5, the grain boundary length in a field of view of 1 mm² in the cross section of the copper member exceeded 30 mm, and the surface roughness after the temperature cycle test was large.

Figure 6:
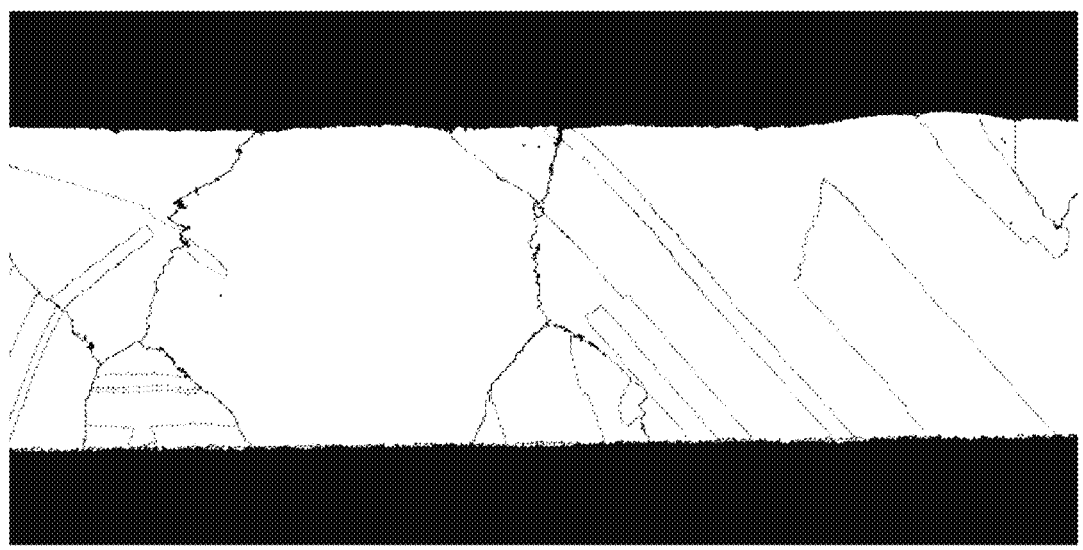
FIG. 6 is a diagram showing an accumulated state of strain in a circuit layer after a temperature cycle test of Comparative Example 7 in the examples.
Figure 6:
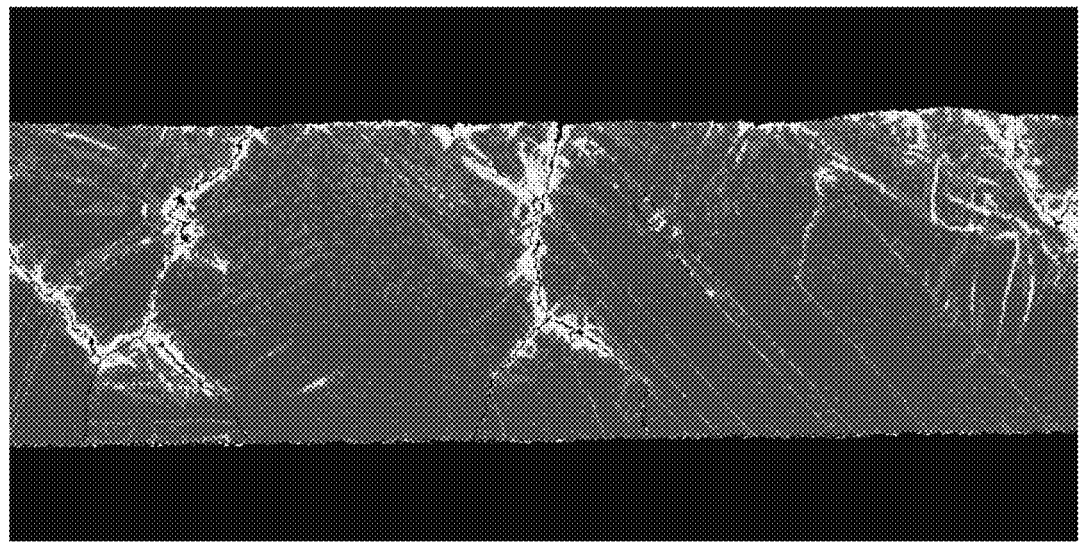

In Comparative Example 7, the proportion of twin boundaries represented by Σ3 grain boundaries to the total grain boundaries exceeded 50%, and the surface roughness after the temperature cycle test was large (see FIG. 6).

Figure 5:
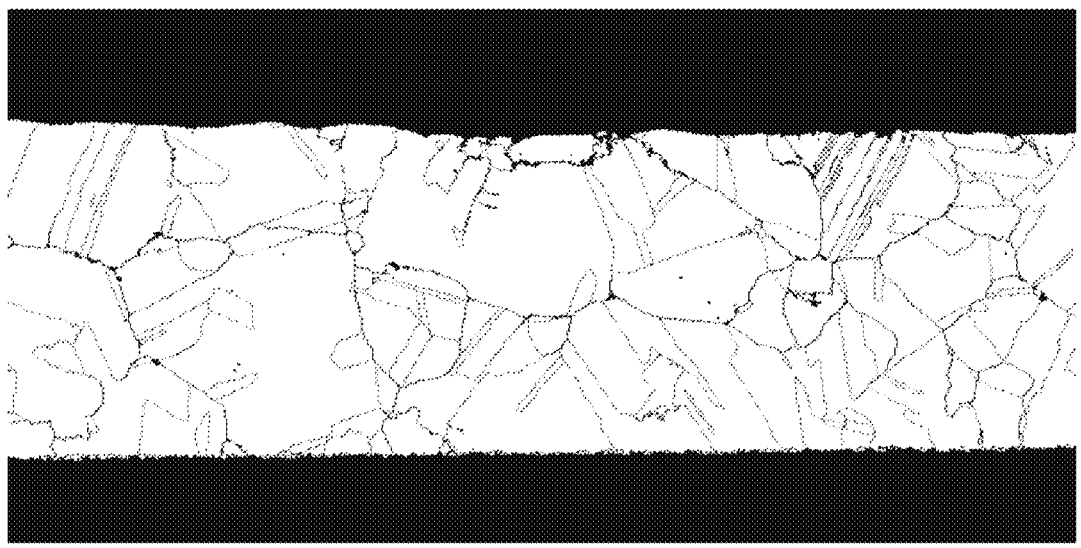
FIG. 5 is a diagram showing an accumulated state of strain in a circuit layer after a temperature cycle test of Present Invention Example 10 in examples.
Figure 5:
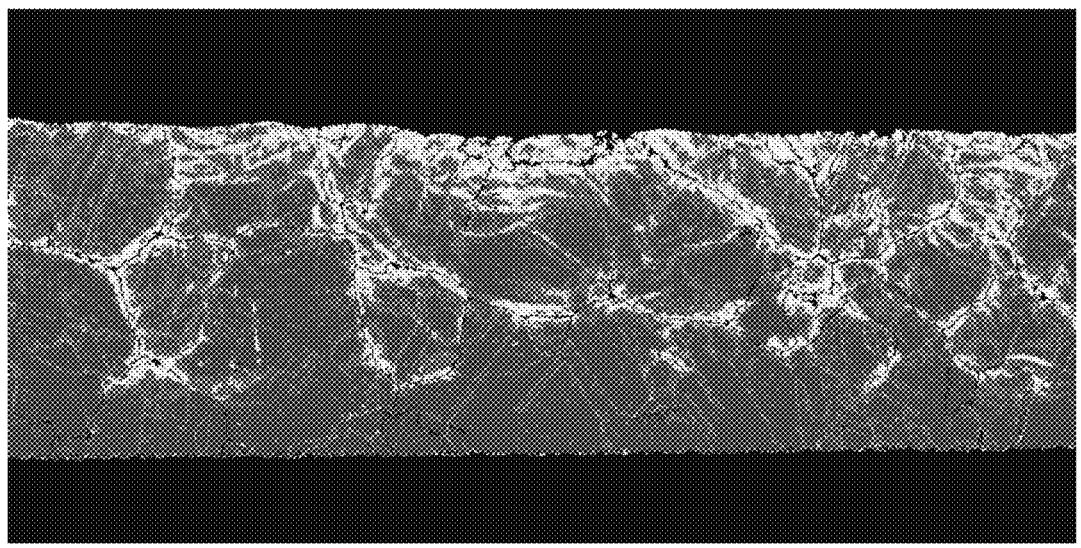

Contrary to this, in Present Invention Examples 1 to 32, the maximum area ratio when the crystal orientation map of copper obtained by EBSD in the cross section of the copper plate was trisected into (001) planes, (111) planes, and (101) planes was 45% or less (see FIG. 3A for Present Invention Example 21), the grain boundary length in a field of view of 1 mm² in the cross section of the copper plate was set to 10 mm or more and less than 30 mm (see FIG. 4A for Example 16 of the Present Invention), and the surface roughness before and after the temperature cycle test did not change significantly (see FIG. 5 for Example 10 of the Present Invention).

From the above, according to the present invention examples, it was confirmed that it is possible to provide A method of producing a copper/ceramic bonded body in which the coarsening and non-uniformity of crystal grains of a copper member can be suppressed even after bonding, A method of producing an insulating circuit board, a copper/ceramic bonded body, and an insulating circuit board.

INDUSTRIAL APPLICABILITY

According to the present invention, A method of producing a copper/ceramic bonded body in which the coarsening and non-uniformity of crystal grains of a copper member can be suppressed even after bonding and undulations on the surface of the copper member can be suppressed even in a case where a temperature cycle is applied, A method of producing an insulating circuit board, a copper/ceramic bonded body, and an insulating circuit board can be provided.

REFERENCE SIGNS LIST

10: Insulating circuit board (copper/ceramic bonded body)
11: Ceramic substrate
12: Circuit layer
13: Metal layer

What is claimed is:

1. A method of producing a copper/ceramic bonded body with a copper member and a ceramic member bonded each other, the copper member having a composition having a Cu purity of 99.96 mass % or more, a balance of inevitable impurities, a P content of 2 mass ppm or less, and a total content of Pb, Se and Te of 10 mass ppm or less, the method comprises:
a bonding step of bonding the copper member and the ceramic member laminated to each other by pressing the laminated copper member and ceramic member in a laminating direction and heating,
wherein an average crystal grain size of the copper member before bonding is set to 10 μm or more,
an aspect ratio, which means a ratio of a major axis to a minor axis of a crystal grain on a rolled surface, is set to 2 or less, and
in the bonding step, a pressing load in the laminating direction is set to be in a range of 0.05 MPa or more and 1.5 MPa or less, a heating temperature is set to be in a range of 800° C. or higher and 850° C. or lower, and a holding time at the heating temperature is set to be in a range of 10 minutes or longer and 90 minutes or shorter.

2. The method of producing a copper/ceramic bonded body according to claim 1,
wherein an aspect ratio R0 of the crystal grain on the rolled surface of the copper member before the bonding, an aspect ratio R1 of the crystal grain on the rolled surface of the copper member after the bonding, and an average crystal grain size D1 on the rolled surface of the copper member after the bonding satisfy the following relational expression RD, Relational expression $RD = D1 \times (R1/R0) \leq 500$.

3. The method of producing a copper/ceramic bonded body according to claim 1,
wherein a S content in the copper member is set to be in a range of 2 mass ppm or more and 20 mass ppm or less.

4. The method of producing a copper/ceramic bonded body according to claim 1,
wherein a total content of Mg, Sr, Ba, Ti, Zr, Hf, and Y in the copper member is 10 mass ppm or less.

5. A method of producing an insulating circuit board with a ceramic substrate and a copper plate bonded to a surface of the ceramics substrate,
the method comprising the step of bonding the ceramic substrate as the ceramic member and the copper plate as the copper member to each other by the method of producing a copper/ceramic bonded body according to claim 1.

6. A copper/ceramic bonded body comprising a copper member and a ceramic member bonded to each other, wherein
the copper member has a composition having a Cu purity of 99.96 mass % or more, a balance of inevitable impurities, a P content of 2 mass ppm or less, and a total content of Pb, Se and Te of 10 mass ppm or less,
in a cross section of the copper member, a maximum area ratio is set to 45% or less when a crystal orientation map of copper obtained by EBSD is trisected into (001) planes, (111) planes, and (101) planes, and
a grain boundary length in a field of view of 1 mm² in the cross section of the copper member is set to 10 mm or more and less than 30 mm.

7. The copper/ceramic bonded body according to claim 6, wherein
as a result of observing the cross section of the copper member by an electron backscatter diffraction method, a proportion of twin boundaries represented by Σ3 grain boundaries to total grain boundaries is 50% or less.

8. The copper/ceramic bonded body according to claim 6, wherein, when an arithmetic average roughness of a surface of the copper member after conducting a temperature cycle test of holding at −45° C. for 30 minutes and holding at 250° C. for 30 minutes is defined as $Ra_1$, and an arithmetic average roughness of the surface of the copper member before conducting the temperature cycle test is defined as $Ra_0$, $Ra_1/Ra_0$ is in a range of 1.0 or more and 1.8 or less.

9. An insulating circuit board comprising a ceramic substrate and a copper plate bonded to a surface of the ceramic substrate, wherein the copper plate has a composition having a Cu purity of 99.96 mass % or more, a balance of inevitable impurities, a P content of 2 mass ppm or less, and a total content of Pb, Se and Te of mass ppm or less, in a cross section of the copper plate, a maximum area ratio is set to 45% or less when a crystal orientation map of copper obtained by EBSD is trisected into (001) planes, (111) planes, and (101) planes, and a grain boundary length in a field of view of 1 mm$^2$ in the cross section of the copper plate is set to 10 mm or more and less than 30 mm.

10. The insulating circuit board according to claim 9, wherein as a result of observing the cross section of the copper plate by an electron backscatter diffraction method, a proportion of twin boundaries represented by Σ3 grain boundaries to total grain boundaries is 50% or less.

11. The insulating circuit board according to claim 9, wherein, when an arithmetic average roughness of a surface of the copper plate after conducting a temperature cycle test of holding at −45° C. for 30 minutes and holding at 250° C. for 30 minutes is defined as $Ra_1$, and an arithmetic average roughness of the surface of the copper plate before conducting the temperature cycle test is defined as $Ra_0$, $Ra_1/Ra_0$ is in a range of 1.0 or more and 1.8 or less.

* * * * *